United States Patent
Merckling

(10) Patent No.: US 9,082,616 B2
(45) Date of Patent: Jul. 14, 2015

(54) III-V DEVICE AND METHOD FOR MANUFACTURING THEREOF

(71) Applicant: IMEC, Leuven (BE)

(72) Inventor: Clement Merckling, Schaarbeek (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 14/279,033

(22) Filed: May 15, 2014

(65) Prior Publication Data

US 2014/0339680 A1 Nov. 20, 2014

(30) Foreign Application Priority Data

May 17, 2013 (EP) .................................... 13168201

(51) Int. Cl.
| | |
|---|---|
| *H01L 21/331* | (2006.01) |
| *H01L 21/4763* | (2006.01) |
| *H01L 29/06* | (2006.01) |
| *H01L 31/0336* | (2006.01) |
| *H01L 21/02* | (2006.01) |
| *H01L 29/20* | (2006.01) |

(52) U.S. Cl.
CPC ...... *H01L 21/02538* (2013.01); *H01L 21/0245* (2013.01); *H01L 21/0262* (2013.01); *H01L 21/02381* (2013.01); *H01L 21/02461* (2013.01); *H01L 21/02463* (2013.01); *H01L 21/02543* (2013.01); *H01L 21/02546* (2013.01); *H01L 21/02549* (2013.01); *H01L 21/02612* (2013.01); *H01L 21/02636* (2013.01); *H01L 29/20* (2013.01)

(58) Field of Classification Search
CPC .................. H01L 21/02538; H01L 21/02612; H01L 21/02639

USPC .................................. 438/357, 360, 363, 641
See application file for complete search history.

(56) References Cited

U.S. PATENT DOCUMENTS

| | | | |
|---|---|---|---|
| 8,890,213 B2 * | 11/2014 | Yamanaka et al. ............ | 257/197 |
| 2008/0029756 A1 | 2/2008 | Hudait et al. | |
| 2008/0032478 A1 | 2/2008 | Hudait et al. | |
| 2008/0073639 A1 | 3/2008 | Hudait et al. | |
| 2011/0086491 A1 | 4/2011 | Ko et al. | |
| 2012/0032234 A1 | 2/2012 | Wang et al. | |
| 2012/0068207 A1 * | 3/2012 | Hata et al. ....................... | 257/94 |

FOREIGN PATENT DOCUMENTS

JP    2005-85916    3/2005

OTHER PUBLICATIONS

European Search Report, European Patent Application No. 13168201.5 dated Dec. 13, 2013.

(Continued)

*Primary Examiner* — Hsien Ming Lee
(74) *Attorney, Agent, or Firm* — McDonnell Boehnen Hulbert & Berghoff LLP

(57) ABSTRACT

The disclosure relates to a method for manufacturing a III-V device and the III-V device obtained therefrom. The method comprises providing a semiconductor substrate including at least a recess area and forming a buffer layer overlying the semiconductor substrate in the recess area. The buffer layer includes a binary III-V compound formed at a first growth temperature by selective epitaxial growth from a group III precursor and a group V precursor in the presence of a carrier gas. The first growth temperature is equal or slightly higher than a cracking temperature of each of the group III precursor and of the group V precursor.

19 Claims, 8 Drawing Sheets

(56) References Cited

OTHER PUBLICATIONS

Wang, G. et al., "Selective Epitaxial Growth of InP in STI Trenches on Off-Axis Si (001) Substrates", ECS Transactions, vol. 27, No. 1, Jan. 1, 2010, pp. 959-964.

Waldron, Niamh et al., "Integration of InGaAs Channel n-MOS Devices on 200 mm Si Wafers Using the Aspect-Ratio-Trapping Technique", ECS Transactions, vol. 45, No. 4, 2012, pp. 115-128.

Wang, G. et al., "Growth of High Quality InP Layers in STI Trenches on Miscut Si (0 0 1) Substrates", Journal of Crystal Growth, vol. 315, 2011, pp. 32-36.

* cited by examiner

III-V DEVICE AND METHOD FOR MANUFACTURING THEREOF

CROSS-REFERENCE TO RELATED APPLICATION

This application claims priority to European Patent Application No. 13168201.5 filed on May 17, 2013, the contents of which are hereby incorporated by reference

BACKGROUND

The present disclosure relates to a III-V semiconductor device on a group IV semiconductor substrate. Further, the present disclosure relates to a method for manufacturing a III-V semiconductor device on a group IV semiconductor substrate.

A variety of electronic and optoelectronic devices can be enabled by developing thin film relaxed lattice constant III-V semiconductors on silicon (Si) substrates. Surface layers capable of achieving the performance advantages of III-V materials may host a variety of high performance electronic devices, such as CMOS and quantum well (QW) transistors fabricated from extreme high mobility materials such as, but not limited to, indium antimonide (InSb), indium gallium arsenide (InGaAs) and indium arsenide (InAs). Optical devices such as lasers, detectors and photovoltaics may also be fabricated from various other direct band gap materials, such as, but not limited to, gallium arsenide (GaAs) and indium gallium arsenide (InGaAs). These devices can be further enhanced by integrating them on the same substrate with conventional devices of silicon.

Despite all these advantages, the growth of III-V materials upon silicon substrates presents many challenges. Crystal defects are generated by lattice mismatch, polar-on nonpolar mismatch, and thermal mismatch between the III-V semiconductor epitaxial layer and the silicon semiconductor substrate. Many defects, particularly threading dislocations and twins, tend to propagate into the "device layers" where the III-V semiconductor device is fabricated. Generally, the severity of defect generation correlates to the amount of lattice mismatch between the III-V semiconductor and the silicon substrate.

Various buffer layers have been used in attempts to relieve the strain induced by the lattice mismatch between the silicon substrate and the III-V device layer and to thereby reduce the detrimental defect density of the device layer. Viable solutions have been developed for growing III-V materials in wide trenches (or trenches with a width greater than 100 nm), however forming high quality crystalline III-V materials in sub-50 nm trenches required by the continuous scaling of III-V devices on Si substrates remains an unsolved important challenge.

SUMMARY OF THE DISCLOSURE

The present disclosure relates to a method for manufacturing a III-V semiconductor device on a group IV semiconductor substrate. More specifically, the present disclosure relates to a method for forming the layers at the interface between a III-V semiconductor device and a silicon substrate.

The disclosure is thus related to a method for manufacturing a III-V device that includes providing a semiconductor substrate comprising at least a recess area and forming a buffer layer overlying the semiconductor substrate in the recess area. The buffer layer includes a binary III-V compound formed at a first growth temperature by selective epitaxial growth from a group III precursor and a group V precursor in the presence of a carrier gas. The first growth temperature is equal or slightly higher than a cracking temperature of each of the group III precursor and of the group V precursor.

In different embodiments of the disclosure, the method further includes, after forming the buffer layer, forming a stack of layers in the recess area, each layer of the stack comprising a III-V compound. A growth temperature of each of the layers of the stack is higher than the first growth temperature.

In different embodiments, the stack of layers includes an upper layer comprising a third III-V compound that is suitable to form a high mobility channel layer, and an intermediate layer comprising a second III-V compound having a wide band gap (WBG) underlying the upper layer and overlying the buffer layer.

In an embodiment, the stack of layers and the buffer layer are grown selectively by Metal-Organic Vapor Phase Epitaxy (MOVPE), preferably in-situ. Thus, the buffer layer and the stack of layer may be formed under controlled environment, possibly on the same production tool or even the same deposition chamber.

In different embodiments the carrier gas is $N_2$ or Ar.

In different embodiments the first III-V binary compound may be selected from the group consisting of InAs, InP, GaAs, GaP, GaSb, and InSb.

Further, the group III precursor used to form the first III-V binary compound may be chosen from the group consisting of TMIn, TMGa, and TEGa, as explained in the following detailed description.

Furthermore, the group V precursor used to form the first III-V binary compound may be chosen from the group consisting of TBAs, TBP, TBBDMAP, TMSb, and TDMASb, as explained in the following detailed description.

In specific embodiments, the first III-V binary compound is InAs or InP and the first growth temperature is lower or equal to 350° C.

In specific embodiments, the growth temperature of each of the layers of the stack overlying the buffer layer is at least 450° C.

In different embodiments, the trenches have a width smaller than 50 nm. However, the method of the disclosure can be also successfully applied to wider trenches, or trenches having a width of more than 50 nm.

Another aspect the present disclosure relates to a III-V semiconductor device on a group IV semiconductor substrate. More specifically the present disclosure discloses III-V device that includes a semiconductor substrate comprising at least a recess area, and a buffer layer in the recess area comprising a first III-V binary compound selected from the group consisting of InAs, InP, GaAs, GaP, GaSb, and InSb overlying the semiconductor substrate. The first III-V binary compound is highly crystalline, being characterized by a rocking curve with a Full Width at Half Maximum Intensity (FWHM) of less than 700 arcsec (in another example, less than 500 arcsec) as measured by X-ray Diffraction (XRD).

In different embodiments, a stack of layers may overly and contact the buffer layer in the recess area. For example, the stack of layers may include an upper layer comprising a third III-V material that is suitable to form a high mobility channel layer, and an intermediate layer comprising a second III-V material having a wide band gap (WBG) underlying the upper layer and overlying the buffer layer.

In an embodiment, the third III-V material of the upper layer of the stack is selected from the group consisting of $In_xGa_{(1-x)}As$ with x>0.5, InAs, GaSb, InSb, and $In_xGa_{(1-x)}Sb$ with x<0.4.

In an embodiment, the second III-V material of the intermediate layer of the stack is selected from the group consisting of $In_xAl_{(1-x)}As$ with x>0.5, and $In_xAl_{(1-x)}Sb$ with x<0.4.

In an embodiment, the III-V device of the disclosure may further comprise a seed layer underlying and in contact with the buffer layer and overlying and in contact with the substrate. Preferably the seed layer comprises Ge. In particular embodiments the seed layer is made of Ge which shows less lattice mismatch with III-V layers than silicon.

BRIEF DESCRIPTION OF THE DRAWINGS

All drawings are intended to illustrate some aspects and embodiments of the present disclosure. The drawings described are only schematic and are non-limiting.

DETAILED DESCRIPTION

Figure 1:
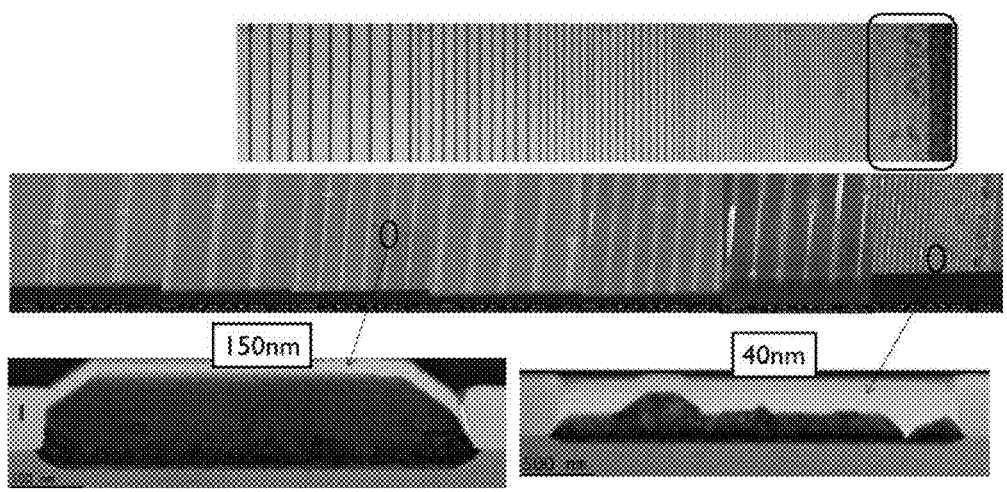
FIG. 1 shows Transmission Electron Microscopy pictures of InP grown by MOVPE at 350° C. in 150 nm trenches (left) and 40 nm trenches (right) on a Si substrate.

The present disclosure relates to integrating III-V semiconductor devices on silicon substrates. More particularly, this disclosure relates to the layers at the interface between a III-V semiconductor device and the silicon substrate.

Further, the present disclosure relates to a method for forming a III-V material having improved crystallinity in narrow trenches on semiconductor substrates. Furthermore, it relates to a method for forming a III-V device having a channel layer that overlays the III-V material with improved crystallinity.

The present disclosure will be described with respect to particular embodiments and with reference to certain drawings but the disclosure is not limited thereto. The drawings described are only schematic and are non-limiting. In the drawings, the size of some of the elements may be exaggerated and not drawn on scale for illustrative purposes. The dimensions and the relative dimensions may not correspond to actual reductions to practice of the disclosure.

Furthermore, the terms first, second and the like in the description, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, under and the like in the description are used for descriptive purposes and not necessarily for describing relative positions. It is to be understood that the terms so used are interchangeable under appropriate circumstances and that the embodiments of the disclosure described herein are capable of operation in other orientations than described or illustrated herein.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Where, herein, a specific chemical name or formula is given, the material may include non-stoichiometric variations of the stoichiometrically exact formula identified by the chemical name. Lack of numerical subscript by an element in the formula stoichiometrically signifies the number one (1). Variations in the range plus/minus 20% of the exact stoichiometric number are comprised in the chemical name or formula, for the present purposes. Where an algebraic subscript is given, then variations in the range of about plus/minus 20% are comprised relative to the value of each subscript. Such varied values do not necessarily sum to a whole number and this departure is contemplated. Such variations may occur due to either intended selection and control of the process conditions, or due to unintended process variations.

In the present disclosure, the term 'III-V compound' or 'III-V material' denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors that can be used in the present disclosure include, but are not limited to alloys of GaAs, InP, InSb, InGaAs, AlGaAs, InAlAs, InAlAsSb, InAlAsP, and InGaAsP.

Throughout this disclosure, the term 'band gap' refers to the energy difference between the top of the valence band and the bottom of the conduction band. In general, a wide band gap (WBG) semiconductor is a semiconductor material with an electronic band gap larger than 1 eV and, preferably, larger than 2 eV. In general, a narrow band gap (NBG) semiconductor is a semiconductor material with an electronic band gap smaller than 1 eV and, preferably, smaller than 0.6 eV. However, the absolute ranges described above are only informative, since throughout this disclosure, it is the relative difference between the WBG and NBG that will determine the good working of the device, rather than the actual absolute value of the band gap.

In the present disclosure, the term "semiconductor" denotes a material with a resistivity of about $10^5$ Ω·cm (e.g., intrinsic Si has a resistivity of about 240 kΩ·cm), while a "semi-insulator" denotes a material with a higher resistivity value, of about $10^9$ Ω·cm.

In a first aspect the present disclosure, a method for manufacturing a III-V device includes providing a semiconductor substrate comprising at least a recess area, and forming a buffer layer overlying the semiconductor substrate in the recess area. The buffer layer comprises a binary III-V compound formed at a first growth temperature by selective epitaxial growth from a group III precursor and a group V precursor in the presence of a carrier gas. The first growth temperature is equal or slightly higher than a cracking temperature of each of the group III precursor and the group V precursor.

In embodiments of the disclosure, a semiconductor substrate is any substrate comprising a semiconductor material made of a group IV element (such as silicon, germanium, tin, and the like) or an alloy of group IV elements or a III-V compound. In different embodiments, the semiconductor substrate can be a silicon wafer, a silicon on insulator (SOI) substrate, or a germanium or insulator (GeOI) substrate of any diameter. Further the semiconductor substrate may comprise additional layers or materials compatible with the semiconductor manufacturing, such as quartz, glass, III-nitride stack of layers, etc. In a particular example, the semiconductor substrate has a top surface made of silicon with a (001) orientation.

The cross section of the recess area can have a flat, round, or a V-shape. In particular embodiments of the disclosure, the recess area in the semiconductor substrate is a trench formed by removing the semiconductor substrate from an active area of a shallow trench isolation (STI) pattern on the semiconductor substrate. The method of the disclosure may be particularly advantageous for narrow trenches, e.g., trenches having a width smaller than 50 nm. In such narrow trenches, the known methods give poor results, e.g., poor crystallinity and non-planar III-V material filling the trench. The method of the disclosure solves this problem for narrow trenches but it is not limited thereto since it can be successfully applied to large trenches, e.g., trenches having a width larger than 50 nm, or larger than 100 nm.

To illustrate the limits of the conventional methods involving MOVPE growth in narrow trenches, comparative results are shown in FIG. 1. The pictures of FIG. 1 show the cross-section TEM for an InP layer grown by selective epitaxial process at 420° C. from tributyl phosphine (TBP) and trimethyl indium (TMIn) with $H_2$ as a carrier gas. FIG. 1 shows, on the left, InP grown in 150 nm trenches and, on the right, InP grown in 40 nm trenches.

In MOVPE, ultra pure gases are injected into a reactor and finely dosed to deposit a very thin layer of atoms onto a semiconductor wafer, for example. Surface reaction of organic compounds or metalorganics and hydrides containing the required chemical elements creates conditions for crystalline growth or epitaxy of materials and compound semiconductors. Unlike traditional silicon semiconductors, these semiconductors may contain combinations of Group III and Group V, Group II and Group VI, Group IV, or Group IV, V and VI elements.

For example, indium phosphide may be grown in a reactor on a heated substrate by introducing trimethylindium (($CH_3$)$_3$In) and phosphine ($PH_3$) in a first step. The heated organic precursor molecules decompose in the absence of oxygen in process known also as pyrolysis. Pyrolysis leaves the atoms on the substrate surface in a second step. The atoms bond to the substrate surface and a new crystalline layer is grown in a third step. Formation of this epitaxial layer occurs at the substrate surface.

Required pyrolysis temperature, also referred to as decomposition temperature or as cracking temperature, increases with increasing chemical bond strength of the precursor.

As can be observed, for the 150 nm trenches, a good quality InP with a planar profile was grown. In the 40 nm trenches, the InP layer shows poor crystallinity and uncontrolled faceting. The highly defective growth of InP in narrow trenches leads to non-uniform heteroepitaxy, which propagates to the III-V layers of the stack that is grown upon. Generally, this high defect density may be not solved by a chemical mechanical polishing (CMP) step applied after trench overgrowth.

Figure 2A:
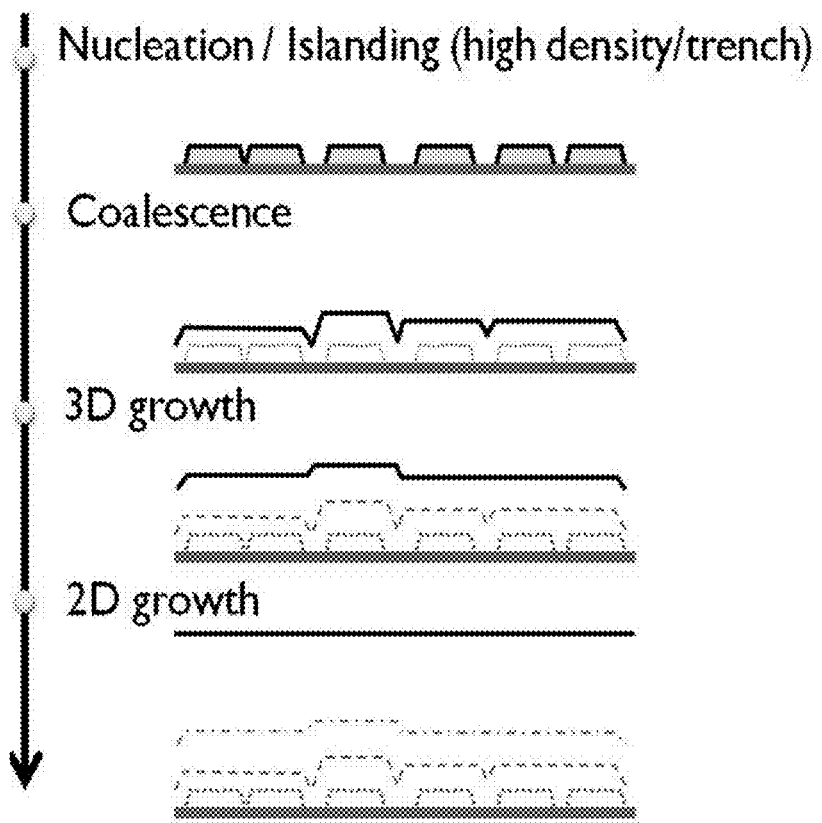
FIGS. 2a and 2b show schematic representations of a proposed growth mechanism for the selective epitaxial growth (SEG) of III-V compounds at high temperatures in trenches having (a) a width higher than 100 nm and (b) a width smaller than 50 nm.

The poor crystallinity of the III-V material in narrow trenches is assignable to the first phases of the growth process. The conventional growth process takes place at temperatures considerably above the cracking temperature (100° C. or more above the cracking temperature), also referred to as high temperature growth. Without being bound by theory, it is proposed that the high temperature growth in wide trenches can be divided in a nucleation phase characterized by a high density island formation, followed by a coalescence phase, a 3D growth phase, and finally a 2D (planar) growth phase, to thereby obtain a III-V material with good crystallinity and a flat surface, as shown in FIG. 2a.

Figure 2B:
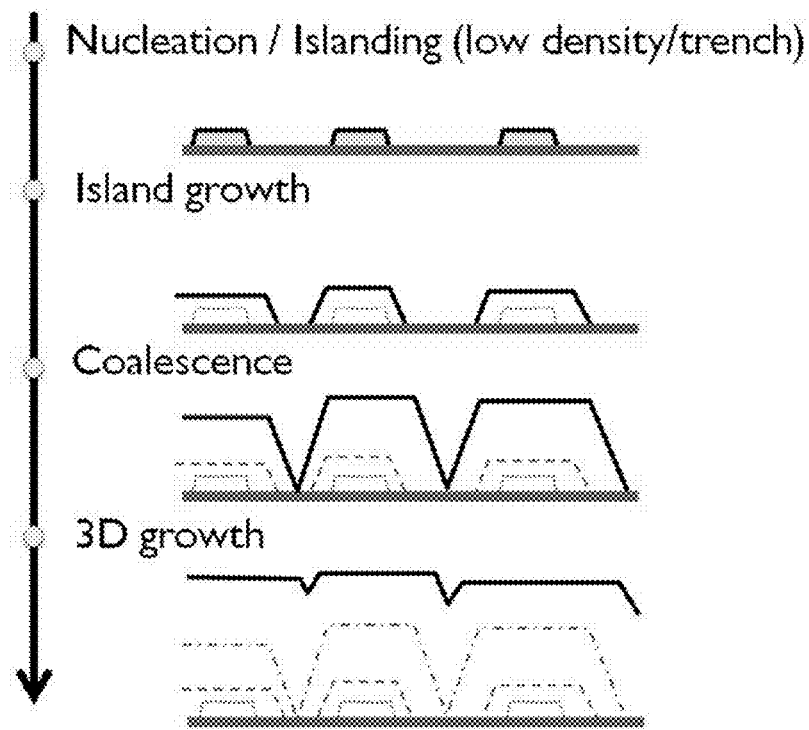

FIG. 2b shows the phases of the growth process in small trenches as proposed to explain the poor crystallinity of the III-V material obtained with a conventional growth process (or as it will be also referred further, the high temperature growth). Without being bound by theory, the high temperature growth process in narrow trenches can be divided in an island growth phase characterized by a low density island formation, followed by island growth and then coalescence, and subsequently followed by a 3D growth phase. The trenches are filled before the 2D phase is reached leading to a non-planar, poor quality III-V material.

In the method of the disclosure, the growth of the buffer layer on the semiconductor substrate at a low temperature reduces the island sizes and increases the island density in the island growth phase in narrow trenches.

Throughout the disclosure, reference to a 'high temperature' generally means a temperature considerably above the precursor cracking temperature, such as, for example, 100° C. or more above the cracking temperature. Further, reference to 'low temperature' generally means a temperature equal or only slightly higher than the precursor cracking temperature, such as, for example, 50° C. or less above the cracking temperature, 30° C. or less above the cracking temperature, or 20° C. or less above the cracking temperature.

The growth temperature of the buffer layer is reduced to values in the vicinity of the cracking temperature of the precursors used. In addition, low cracking temperature precursors are selected for the formation of the buffer layer. Thereby, a III-V material with an improved crystallinity and a planar surface is obtained. The improved crystallinity can be quantified from the corresponding rocking curve measured by XRD. Rocking Curves are a useful way to study perfection in thin films and bulk single crystals. By fixing the detector at the center of the expected Bragg reflection and following the diffracted intensity as the sample is independently rotated (or "rocked"), one can gain valuable information. The full width at half maximum intensity (FWHM) is related to the dislocation density in the film and to the curvature of the sample.

Figure 3:
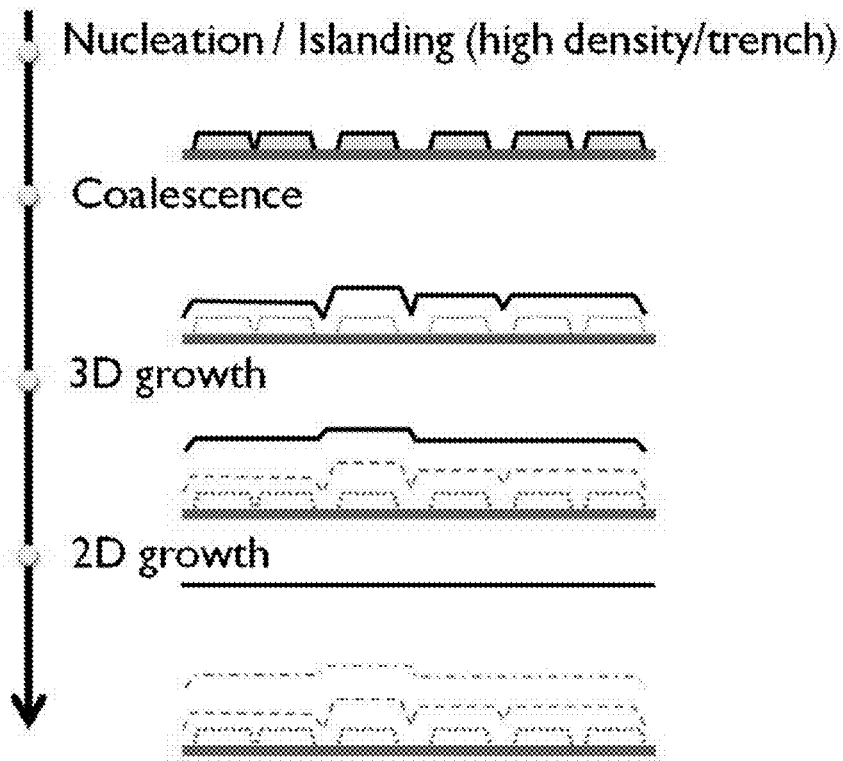
FIG. 3 represents schematically a proposed growth mechanism for the selective epitaxial growth (SEG) of III-V compounds at low temperatures in trenches with a width smaller than 50 nm.

A possible mechanism for the growth process according to the method of the disclosure is shown schematically in FIG. 3. In the nucleation phase, a high density of small islands are formed first, followed by a coalescence phase, a 3D growth phase, and finally a 2D growth phase leading to highly crystalline and planar III-V material.

In different embodiments of the disclosure, the method of the disclosure further includes, after forming the buffer layer, forming a stack of layers in the recess area, each layer of the stack comprising a III-V compound. A growth temperature of each layer of the stack may be higher than the first growth temperature.

In embodiments of the disclosure, the stack of layers may comprise a plurality of layers, each layer of the stack comprising a III-V material.

In embodiments of the disclosure, the stack of layers may include an upper layer comprising a third III-V compound that is suitable to form a high mobility channel layer for a III-V device (e.g. transistor), and an intermediate layer that includes a second III-V compound having a wide band gap (WBG) underlying the high mobility channel layer and overlying the buffer layer.

In particular embodiments of the disclosure, the intermediate layer including a second III-V compound having a wide band gap (WBG) is underlying and in contact with the high mobility channel layer and overlying and in contact with the buffer layer.

The stack of layers and the buffer layer are grown selectively by MOVPE. In one example, the layers are grown in the same process chamber (in-situ) or in different process chambers on the same tool such that the transfer from one process chamber to the other can be performed under a controlled environment. The controlled environment refers to the pressure and composition of the environment that the substrates are subjected to.

In embodiments if the disclosure, the first growth temperature of the first III-V compound is lower or equal to 350° C., preferably lower than 325° C.

Further, the first growth temperature of the first III-V compound is substantially lower than a growth temperature of any layer of the stack. In particular, the first growth temperature is lower than a growth temperature of the second III-V compound and a growth temperature of the third III-V compound.

In particular embodiments of the disclosure, both the growth temperature of the second III-V compound and the growth temperature of the third III-V compound are at least 450° C.

In particular embodiments of both aspects of the disclosure, the semiconductor substrate may further comprise a seed layer underlying and in contact with the buffer layer. In an example, such a seed layer includes Ge or GaAs, which allows a reduction of the lattice mismatch.

In different embodiments of both aspects of the disclosure, the trenches have a width smaller than 50 nm.

In embodiments of both aspects of the disclosure, the first III-V compound is a binary III-V compound formed by MOVPE from a precursor of a group III element and a precursor of a group V element, in the presence of a carrier gas. In one example, each of the precursors have a low metalorganic cracking efficiency at growth temperatures lower or equal to 350° C. The carrier gas may be a gas heavier than $H_2$. In particular examples, the carrier gas is $N_2$ or Ar.

The growth of the buffer layer may be performed at a first temperature that is equal or slightly higher than the cracking temperature of the precursors used to form the first III-V compound. Because the first temperature is equal or only slightly higher than the cracking temperature, an enhanced wetting of the semiconductor substrate by the precursors is obtained, thereby promoting an island coalescence process of the first III-V compound. Thereby a planar, highly crystalline buffer layer is obtained.

In specific embodiments of both aspects of the disclosure, the first III-V material is a binary III-V compound. More particularly, the first III-V material may be selected from the group consisting of InAs, InP, GaAs, GaP, GaSb, and InSb.

The precursor of the group III element may be selected from the group consisting of trimethyl indium (TMIn), trimethyl gallium (TMGa), and triethyl gallium (TEGa). Further, the precursor of the group V element may be selected from the group consisting of tributyl arsenide (TBAs), tributyl phosphine (TBP), tertiarybutylbis(dimethylamino)phosphine (TBBDMAP), tetramethyl antimonide (TMSb), and tris(dimethylamino) antimonide (TDMASb). The cracking temperatures of the different precursors may be easily retrieved by those skilled in the art in handbooks/manuals about organometallic vapor phase epitaxy, for instance.

In a first example, a buffer layer consisting of InAs was grown in STI trenches (recess areas), which were predefined in a silicon wafer, the trenches having a width of 40 nm. The precursors used were TMIn and TBAs.

Figure 4A:
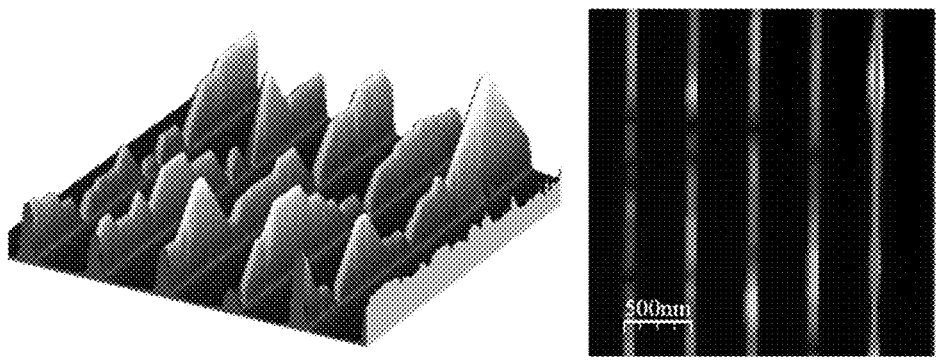
FIGS. 4a and 4b show Atomic Force Microscopy (AFM) pictures and line images of an InAs buffer layer grown in narrow trenches (a) at high temperature and (b) at low temperature.

In a first test, an InAs nucleation layer (buffer layer) was grown in the trench at a high temperature (e.g., 375° C. in $H_2$) directly on the silicon substrate exposed at the bottom of the trench or, alternatively, on a Germanium seed layer that was previously formed on the silicon substrate. The InAs layer obtained at 375° C. in narrow trenches is faceted, which is a clear indication of 3D growth, as shown in the Atomic Force Microscopy (AFM) picture and line image in FIG. 4a.

Figure 4B:
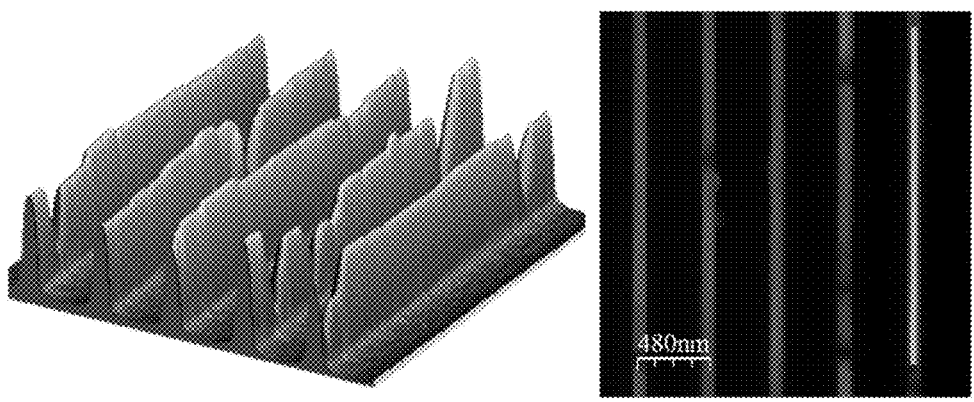

In a second test, an InAs nucleation layer (buffer layer) was grown at a lower temperature (e.g., 325° C. or lower in $H_2$) in the trench directly on the silicon substrate or, alternatively, on a Germanium seed layer that was previously formed on the silicon substrate exposed in the trench. At 325° C., a 2D growth in narrow trenches is obtained as shown on the AFM image and line profile in FIG. 4b.

Figure 5:
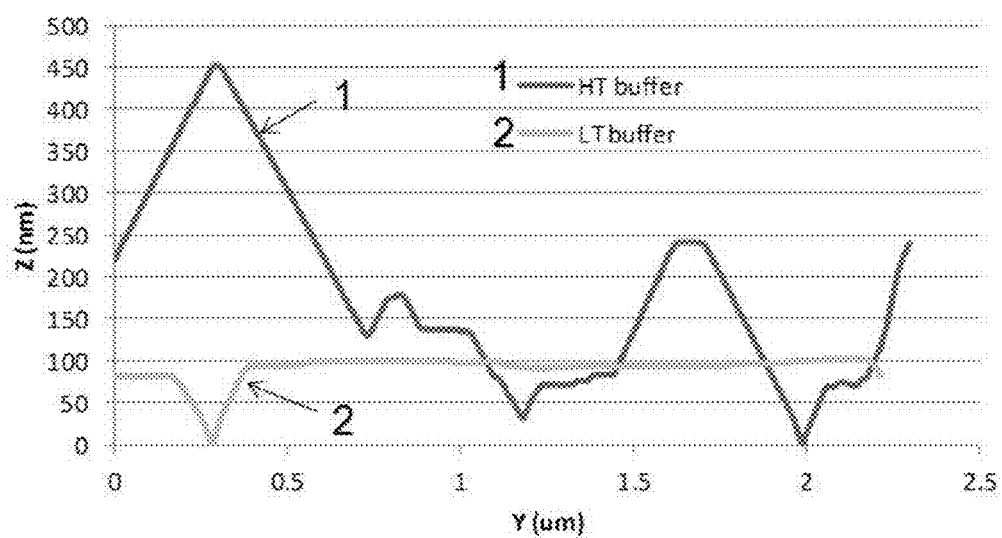
FIG. 5 shows a line profile scan as a function of the trench length of an InAs buffer layer grown in the 40-nm width trenches at (1) high temperature and (2) low temperature.

FIG. 5 shows a line profile scan of the InAs buffer layer of the first example grown in 40 nm trenches as a function of the trench length (microns). A much higher non-uniformity is observed for the high temperature test (1) compared to the low temperature test (2).

In a second example, a buffer layer consisting of InP was grown in STI trenches having a width of 40 nm. In this example, TMIn and TBP were used as precursors, the growth temperature was 350° C., and the carrier gas was $N_2$.

Figure 6A:
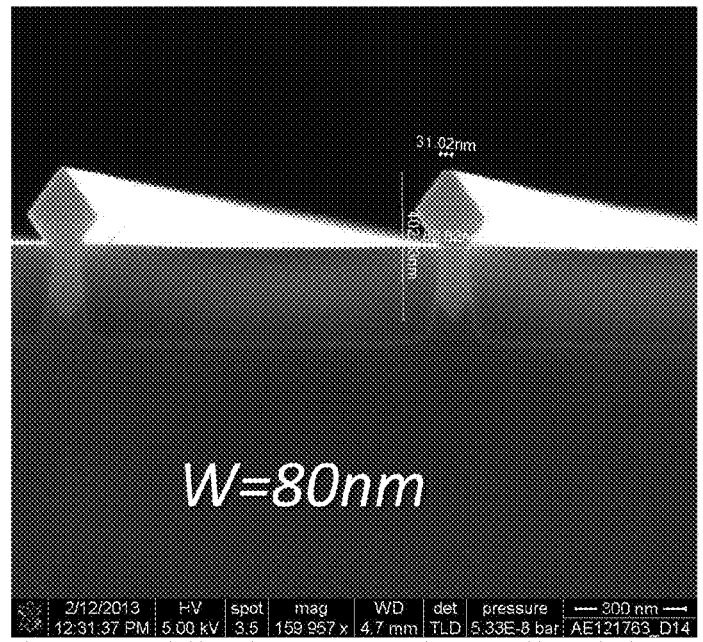
FIGS. 6a and 6b show TEM pictures of InP grown in trenches in accordance with a method of the disclosure and at (a) a trench width of 80 nm and (b) a trench width of 40 nm.
Figure 6B:
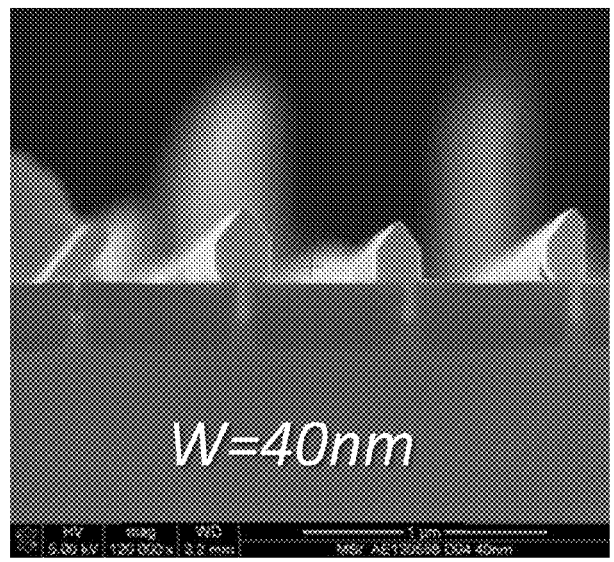

FIGS. 6a and 6b show the cross section TEM pictures of the InP grown in the 80 nm and 40 nm trenches, respectively. In both cases the crystallinity and planarity of the grown InP was very good.

Figure 7:
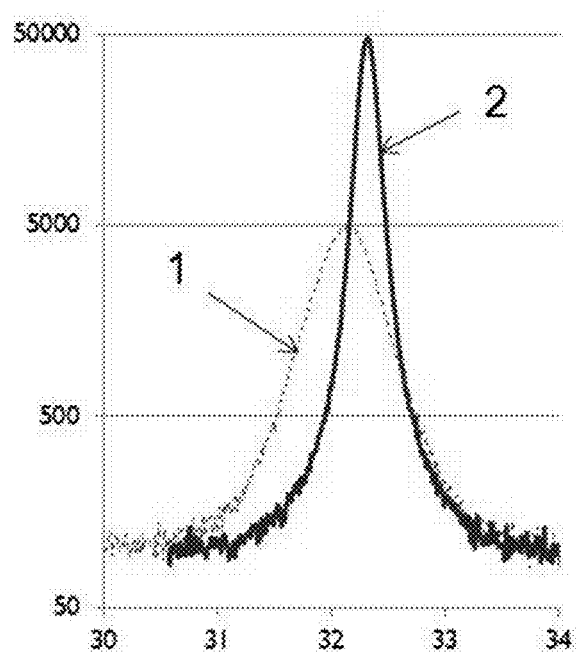
FIG. 7 shows the FWHM of the (004) InP-peak measured by XRD for InP grown in narrow trenches in accordance with the method of the disclosure.

The improved crystallinity is confirmed by the X-ray pattern and, more specifically, by the FWHM value of the (004) InP-peak, as shown in FIG. 7. A sharp peak is obtained having a FWHM value of 0.15° or 540 arcsec, which is much narrower than 0.509° or 1832 arcsec obtained for InP buffer layer formed at 420° C. under $H_2$, for example. In a second test with InP at low temperature 350° C. and $N_2$ as carrier gas, a FWHM value of 450 arcsec was obtained, indicating an even better crystallinity.

In embodiments of both aspects of the disclosure, the second III-V compound of the intermediate layer includes $In_xAl_{(1-x)}As$ with x>0.5 or $In_xAl_{(1-x)}Sb$ with x<0.4. Both compositions are characterized by a wider band gap compared to the high mobility channel (>0.2 eV for Conduction Band Offset or Valence Band Offset), such that the channel is electrically isolated and the carriers are confined in the channel.

In embodiments of the disclosure, the intermediate layer includes $In_xAl_{(1-x)}As$ with x>0.5 and underlies a channel layer made of a third III-V compound that has the same In concentration, e.g., $In_xGa_{(1-x)}As$ with x>0.5. In specific embodiments, the In concentration of both second and third III-V compounds is x=0.7.

In embodiments of both aspects of the disclosure, the third III-V material includes $In_xGa_{(1-x)}As$ with x>0.5, InAs, GaSb, InSb, or $In_xGa_{(1-x)}Sb$ with x<0.4, which are suitable to form a high mobility channel.

A second aspect the disclosure relates to a III-V device that includes semiconductor substrate having at least a recess area, and a buffer layer in the recess area comprising a first III-V compound selected from the group consisting of InAs, InP, GaAs, GaP, GaSb, and InSb overlying the semiconductor substrate. The first III-V compound has a high crystalline quality that is characterized by a rocking curve FWHM of less than 700 arcsec, as measured by X-ray diffraction (XRD).

The X-ray diffraction analysis has been carried out by scanning an area composed of long 5-mm-lenth lines with the width varying from 500 nm down to 40 nm on the mask set in aligning the X-ray setup perpendicularly to the vertical lines.

Furthermore, the III-V device of the disclosure may include a stack of layers overlying the buffer layer in the recess area. In an example, the stack of layers further includes an upper layer comprising a third III-V compound that is suitable to form a high mobility channel layer, and an intermediate layer comprising a second III-V compound having a wide band gap (WBG) underlying the high mobility channel layer and overlying the buffer layer.

In specific embodiments, the intermediate layer includes a second III-V compound having a wide band gap (WBG) underlying and in physical contact with the high mobility channel layer. Further, the intermediate layer may also be overlying and in physical contact with the buffer layer.

In a particular example of the disclosure, the buffer layer consists of InP characterized by rocking curve with a FWHM of 540 arcsec measured in by XRD.

It is an advantage of the III-V device of the disclosure that when a buffer layer made of InAs is used both an intermediate and an upper layer (channel layer) having a higher In concentration can be easily integrated. The advantage of a higher In concentration, e.g., around 70% In is that the electron mobility is further increased.

Figure 8:
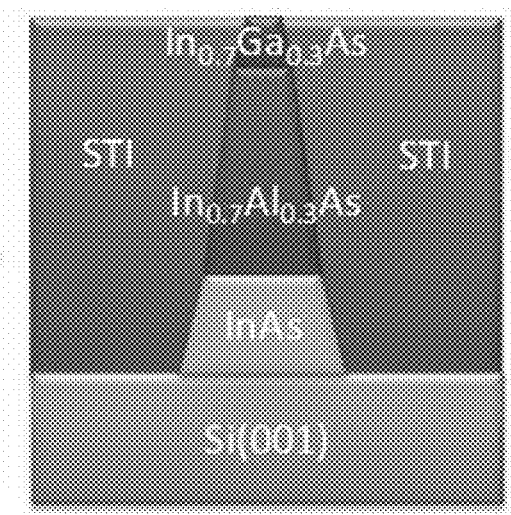
FIG. 8 shows the integration scheme according to a specific embodiment of the disclosure, wherein the low temperature buffer layer is InAs.

An example of such integration scheme is shown in FIG. 8, where shallow trench isolation (STI) areas are delimiting the trench formed on a Si (001) substrate. The second III-V compound of the intermediate layer consists of high In-concentration InAlAs, e.g., $In_{0.7}Al_{0.3}As$. A third III-V compound with high In concentration (e.g., $In_{0.7}Ga_{0.3}As$) is formed thereupon as a channel layer Alternatively, in the embodiments where InP is grown as buffer layer according to the method of the disclosure, a good lattice matching is obtained with the high mobility channel made of $In_{0.53}Ga_{0.47}As$ with an intermediate layer made of $In_{0.52}Al_{0.48}As$. Higher In content layers can be grown by keeping the total thickness below the critical thickness of the system in order to adjust the band offsets of the heterostructure to improve electrostatic characteristics.

The invention claimed is:

1. A method for manufacturing a III-V device comprising:
   providing a semiconductor substrate including at least a recess area; and
   forming a buffer layer overlying the semiconductor substrate in the recess area,
   wherein the buffer layer includes a binary III-V compound formed at a first growth temperature by selective epitaxial growth from a group III precursor and a group V precursor in the presence of a carrier gas,
   and wherein the first growth temperature is lower or equal to 350° C.

2. The method of claim 1 further comprising, after forming the buffer layer, forming a stack of layers in the recess area, wherein each layer of the stack includes a III-V compound, and wherein a growth temperature of each layer of the stack is higher than the first growth temperature.

3. The method of claim 2, wherein the stack of layers further comprise an upper layer including a third III-V compound that is suitable to form a high mobility channel layer, and an intermediate layer including a second III-V compound underlying the upper layer and overlying the buffer layer, wherein a band gap of the intermediate layer is wider than a band gap of the high mobility channel layer.

4. The method of claim 3, wherein the intermediate layer including the second III-V compound is in contact with the buffer layer.

5. The method of claim 3, wherein the intermediate layer including the second III-V compound is in contact with the high mobility channel layer.

6. The method of claim 2, wherein the stack of layers and the buffer layer are grown selectively by Metal-Organic Vapor Phase Epitaxy (MOVPE).

7. The method of claim 6, wherein the stack layers and the buffer layers are grown selectively by MOVPE in-situ.

8. The method of claim 2, wherein the growth temperature of each layer of the stack of layers is at least 450° C.

9. The method of claim 1, wherein the carrier gas is $N_2$ or Ar.

10. The method of claim 1, wherein the binary III-V compound is selected from the group consisting of InAs, InP, GaAs, GaP, GaSb, and InSb.

11. The method of claim 1, wherein the group III precursor is selected from the group consisting of TMIn, TMGa, and TEGa.

12. The method of claim 1, wherein the group V precursor is selected from the group consisting of TBAs, TBP, TBBD-MAP, TMSb, and TDMASb.

13. The method of claim 1, wherein the recess area has a width smaller than 50 nm.

14. A III-V device comprising:
   a semiconductor substrate including at least a recess area;
   a buffer layer in the recess area including a first III-V compound selected from the group consisting of InAs, InP, GaAs, GaP, GaSb, and InSb overlying the semiconductor substrate and having a Full Width at Half Maximum Intensity (FWHM) of less than 700 arcsec as measured by X-ray Diffraction (XRD); and
   a stack of layers overlying the buffer layer in the recess area, wherein the stack of layers further comprises an upper layer including a third III-V compound that is suitable to form a high mobility channel layer, and an intermediate layer including a second III-V compound underlying the upper layer and overlying the buffer layer, wherein a band gap of the intermediate layer is wider than a band gap of the high mobility channel layer.

15. The device of claim 14, wherein the third III-V compound is selected from the group consisting of $In_xGa_{(1-x)}As$ with x>0.5, InAs, GaSb, InSb, and $In_xGa_{(1-x)}Sb$ with x<0.4.

16. The device of claim 14, wherein the second III-V compound is selected from the group consisting of $In_xAl_{(1-x)}As$ with x>0.5 and $In_xAl_{(1-x)}Sb$ with x<0.4.

17. The device of claim 14, further comprising a seed layer underlying and in contact with the buffer layer and overlying and in contact with the substrate, wherein the seed layer includes Ge.

18. The device of claim 14, wherein the intermediate layer including the second III-V compound is in contact with the high mobility channel layer.

19. The device of claim 18, wherein the intermediate layer including the second III-V compound is in contact with the buffer layer.

* * * * *